United States Patent
Tuttle et al.

(10) Patent No.: US 6,781,173 B2
(45) Date of Patent: Aug. 24, 2004

(54) MRAM SENSE LAYER AREA CONTROL

(75) Inventors: Mark E. Tuttle, Boise, ID (US); Joel A. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/230,300

(22) Filed: Aug. 29, 2002

(65) Prior Publication Data

US 2004/0041182 A1 Mar. 4, 2004

(51) Int. Cl.$^7$ ................................................ H01L 29/76
(52) U.S. Cl. ...................... 257/295; 257/429; 365/158; 365/171; 365/173; 360/324.2
(58) Field of Search ........................... 360/324.1, 324.2, 360/324.11, 324.12

(56) References Cited

U.S. PATENT DOCUMENTS 6,226,160 B1 * 5/2001 Gallagher et al. ....... 360/324.2
6,469,879 B1 * 10/2002 Redon et al. ............ 360/324.2

* cited by examiner

*Primary Examiner*—David Nelms
*Assistant Examiner*—Mai-Huong Tran
(74) *Attorney, Agent, or Firm*—Dickstein Shapiro Morin & Oshinsky LLP

(57) ABSTRACT

This invention relates to MRAM technology and new MRAM memory element designs. Specifically, this invention relates to the use of ferromagnetic layers of different sizes in an MRAM element. This reduces magnetic coupling between a pinned layer and a sense layer and provides a more effective memory element. In addition, the design of the present invention reduces the instances of electrical shorts occurring between the ferromagnetic layers in an MRAM element

38 Claims, 9 Drawing Sheets

MRAM SENSE LAYER AREA CONTROL

BACKGROUND OF THE INVENTION

1. Field of the Invention

This invention relates generally to magnetoresistive random access memory (MRAM) devices and, more particularly, to an MRAM memory element structure.

2. Description of the Related Art

Integrated circuit designers have always sought the ideal semiconductor memory: a device that is randomly accessible, can be written or read very quickly, is non-volatile, but indefinitely alterable, and consumes little power. Magnetoresistive random access memory (MRAM) technology has been increasingly viewed as offering all these advantages.

A magnetic memory element has a structure which includes ferromagnetic layers separated by a non-magnetic barrier layer that forms a tunnel junction. Information can be stored as a digital "1" or a "0" as directions of magnetization vectors in these ferromagnetic layers. Magnetic vectors in one ferromagnetic layer are magnetically fixed or pinned, while the magnetic vectors of the other ferromagnetic layer are not fixed so that the magnetization direction is free to switch between "parallel" and "antiparallel" states relative to the pinned layer. This latter ferromagnetic layer is called a "sense" layer. In response to parallel and antiparallel states, the magnetic memory element represents two different resistance states, which are read by the memory circuit as either a "1" or a "0." It is the detection of these resistance states for the different magnetic orientations that allows the MRAM to read information.

Unfortunately, the ability of the memory device to reliably switch states is adversely affected by magnetic coupling between the sense and pinned layers. Magnetic coupling between the sense layer and the pinned layer results in the sense layer being biased toward one magnetic orientation producing a magnetic field offset in the magnetic field required for switching the sense layer during programming. In addition, known MRAM elements may exhibit electrical shorting between the sense layer and the pinned layer through a conductive side wall film which may form during etching to define memory elements. This reduces device yields.

It would be desirable to have an MRAM element with reduced magnetic coupling between the sense and pinned layers and reduced electrical shorting.

SUMMARY

This invention provides an MRAM element which utilizes sense and pinned ferromagnetic layers of different sizes. This reduces magnetic coupling between the sense and pinned layers, and additionally decreases the chance of an electrical short occurring between the layers during device fabrication. This invention also discloses a method for fabricating an MRAM element with sense and pinned layers of different sizes. These and other advantages and features of the invention will be more completely understood from the following detailed description of the invention which is provided in connection with the accompanying drawings.

DETAILED DESCRIPTION

In the following description, reference is made to the accompanying drawings which will serve to illustrate exemplary embodiments of the invention. The description provides sufficient detail to enable those skilled in the art to practice the invention. Of course other embodiments may be used and various changes may be made without departing from the scope of the present invention. The scope of this invention is defined by the appended claims.

The term "substrate" used in the following description may include any supporting structure including, but not limited to, a plastic or a semiconductor substrate that has an exposed substrate surface. Semiconductor substrates should be understood to include silicon, silicon-on-insulator (SOI), silicon-on-sapphire (SOS), doped and undoped semiconductors, epitaxial-layers of silicon supported by a base semiconductor foundation, and other semiconductor structures. When reference is made to a semiconductor substrate or wafer in the following description, previous process steps may have been utilized to form regions or junctions in or over the base semiconductor or foundation.

Figure 1:
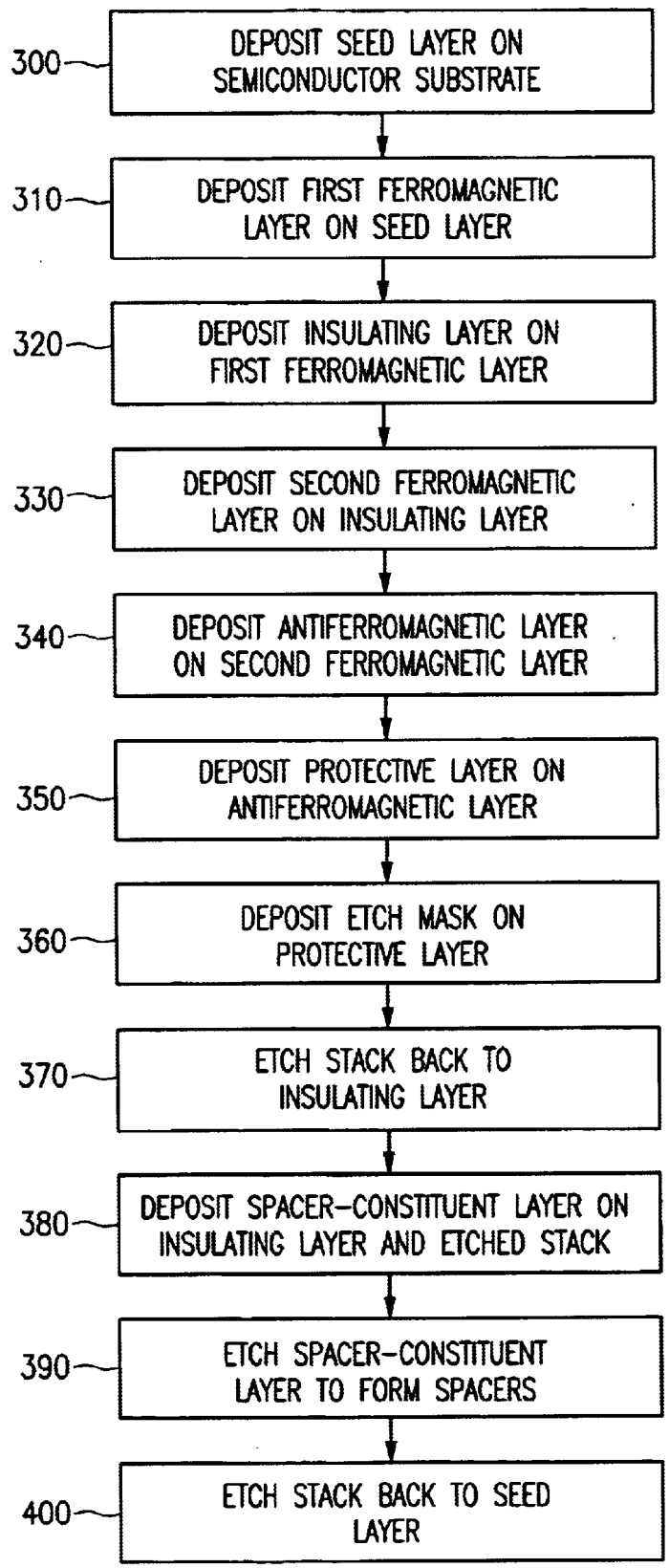
FIG. 1 is a flow chart showing the steps for fabricating a memory element in accordance with a first preferred embodiment of the present invention.
Figure 2:
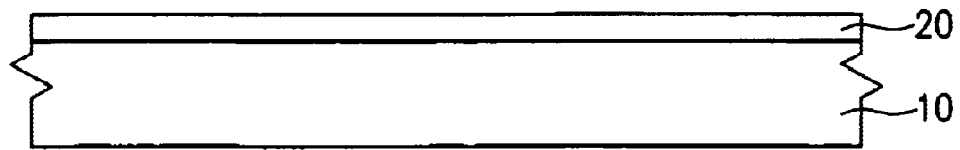
FIG. 2 is a two-dimensional cross-sectional view of a semiconductor substrate provided after the first step of the present invention.

FIG. 1 shows the steps for fabricating a preferred MRAM element of the present invention. At step 300, a seed layer 20 is deposited over a semiconductor substrate 10, resulting in the substrate shown in FIG. 2. Seed layer 20 is preferably formed from tantalum (Ta), but may be formed from any other suitable material known in the art. Seed layer 20 may be deposited by any convenient and suitable method known in the art, such as chemical vapor deposition (CVD), physical vapor deposition (PVD) and sputtering, and has a preferable thickness of about 10 to about 30 angstroms.

Figure 3:
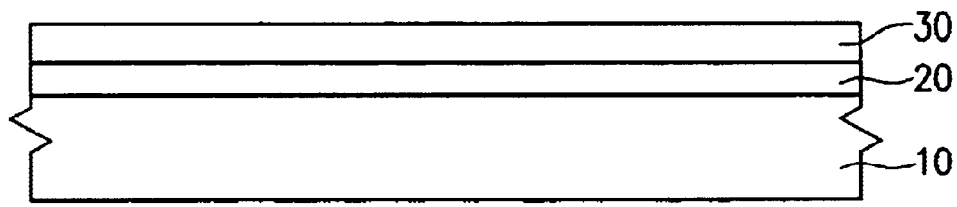
FIG. 3 shows the substrate of FIG. 2 undergoing the process of the preferred embodiment of the present invention.

At step 310 in FIG. 1, a first ferromagnetic layer 30 is deposited on seed layer 20. In a first preferred embodiment of the present invention, first ferromagnetic layer 30 is the sense layer, which freely changes magnetic state responsive to an applied magnetic field. First ferromagnetic layer 30 preferably comprises alloys of one or more of nickel (Ni), iron (Fe), and cobalt (Co), e.g., NiFe or CoFe, and preferably has a thickness of about 20 angstroms to about 100 angstroms, and more preferably about 20 angstroms to about 50 angstroms. First ferromagnetic layer 30 may be deposited by any suitable method familiar in the art. The substrate that results after processing step 310 is shown in FIG. 3.

Figure 4:
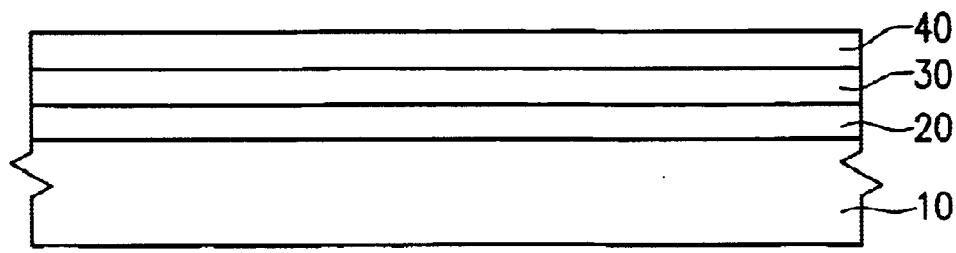
FIG. 4 shows the substrate of FIG. 3 at a processing step subsequent to that shown in FIG. 3.

At step 320, an barrier layer 40 is deposited on first ferromagnetic layer 30. For a Tunnel Magnetoresistance (TMR) MRAM element, barrier layer 40 preferably comprises a tunnel barrier of aluminum oxide, but may also comprise any known TMR MRAM tunnel barrier material. However, the present invention is not limited to TMR elements, and where the desired MRAM element is a Giant Magnetoresistance (GMR) element, for example, barrier layer 40 may be copper or any other appropriate material. Barrier layer 40 is deposited by means known in the art, and results in the substrate shown in FIG. 4.

Figure 5:
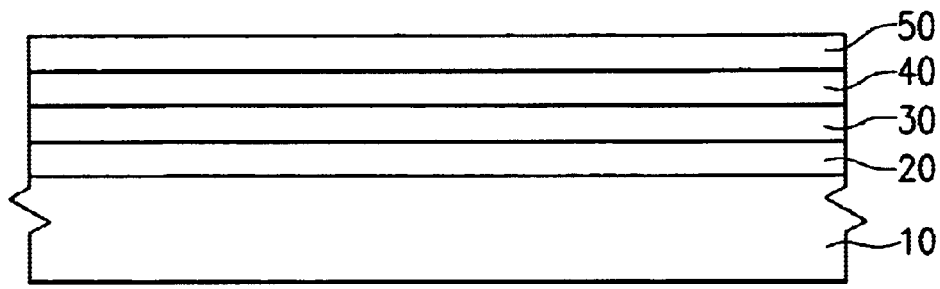
FIG. 5 shows the substrate of FIG. 4 at a processing step subsequent to that shown in FIG. 4.

A second ferromagnetic layer 50 shown in FIG. 5 is next deposited at step 330, referring to FIG. 1. In this embodiment, second ferromagnetic layer 50 is pinned, that is, it remains in the same magnetic state even when an external magnetic field is applied. Second ferromagnetic layer 50, as with first ferromagnetic layer 30, preferably comprises alloys of one or more of Ni, Fe, or Co, e.g., NiFe or CoFe, and preferably has a thickness of about 20 angstroms to about 100 angstroms, and more preferably about 20 angstroms to about 50 angstroms. Second ferromagnetic layer 50 may be deposited by methods known in the art.

Figure 6:
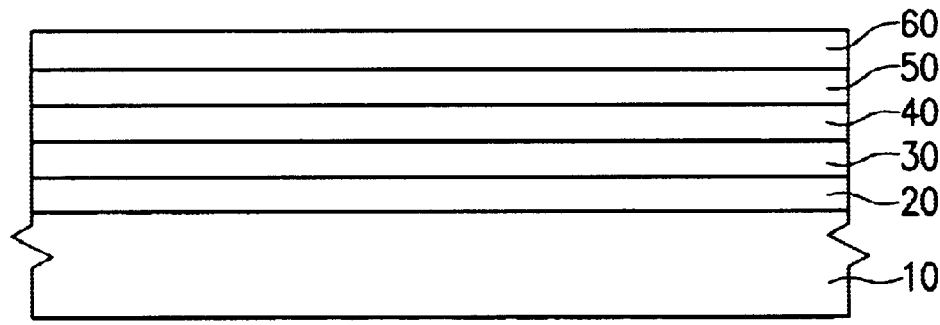
FIG. 6 shows the substrate of FIG. 5 at a processing step subsequent to that shown in FIG. 5.

Referring to FIG. 1, at next step 340, an antiferromagnetic layer 60 is deposited on second ferromagnetic layer 50. Antiferromagnetic layer 60 possesses a crystalline orientation that provides, in this embodiment, second ferromagnetic layer 50 with its pinned or fixed magnetic state. Here, antiferromagnetic layer 60 is preferably iridium manganese (IrMn), but many antiferromagnetic layers suitable for fixing a pinned ferromagnetic layer are known in the art, and these may be utilized in the present invention. Antiferromagnetic layer 60 may be deposited by suitable means known in the art, and preferably has a thickness of about 70 angstroms to about 150 angstroms. This provides the semiconductor substrate shown in FIG. 6.

Figure 7:
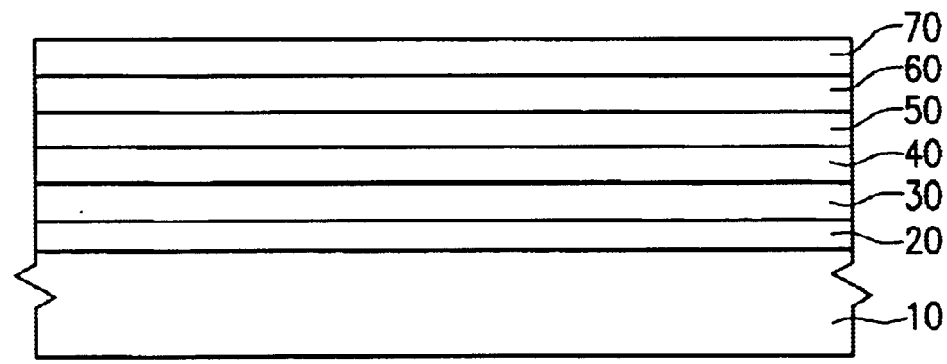
FIG. 7 shows the substrate of FIG. 6 at a processing step subsequent to that shown in FIG. 6.
Figure 8:
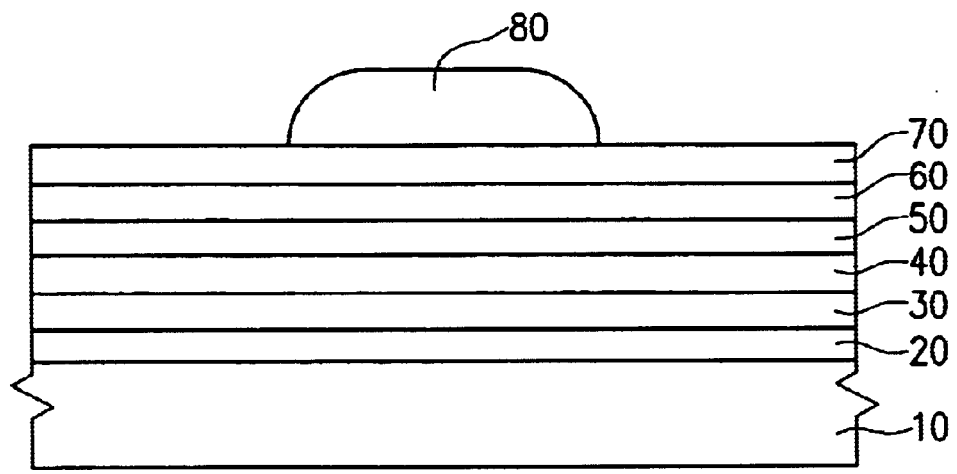
FIG. 8 shows the substrate of FIG. 7 at a processing step subsequent to that shown in FIG. 7.

FIG. 7 shows the substrate resulting from step 350 in FIG. 1. Here, a protective layer 70 is deposited over antiferromagnetic layer 60. Protective layer 70 preferably comprises Ta, although other suitable materials may be used. Step 360 provides the substrate shown in FIG. 8, where etch mask 80 has been deposited in a desired pattern on protective layer 70. Etch mask 80 should be the applied at the width of the desired MRAM element stack. Etch mask 80 may be any mask known in the art that is compatible with etching the layers deposited in the stack of the present invention.

Figure 9:
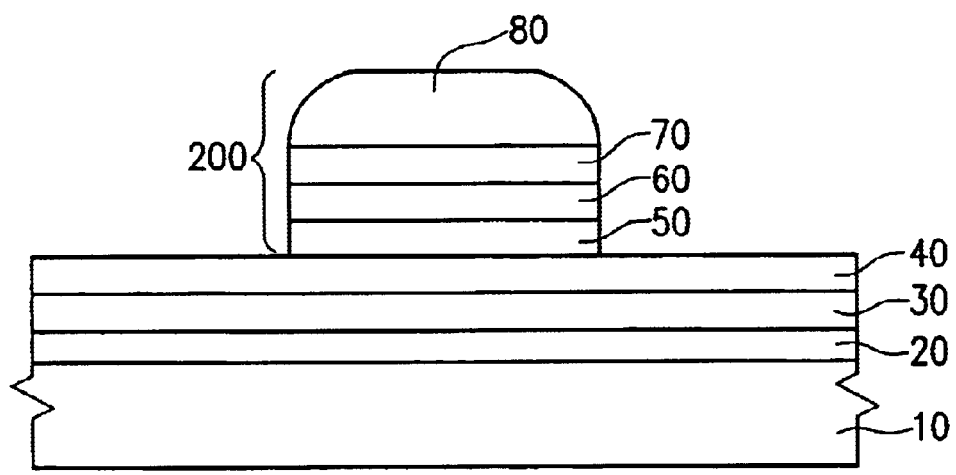
FIG. 9 shows the substrate of FIG. 8 at a processing step subsequent to that shown in FIG. 8.

At step 370 in FIG. 1, the MRAM element stack provided after step 360 is etched back through protective layer 70, antiferromagnetic layer 60, and second ferromagnetic layer 50. The etching ceases before first ferromagnetic layer 30, for example at barrier layer 40, as shown in FIG. 9. Alternatively, the etch may go down to and cease at the first ferromagnetic layer 30. Any etching technique known in the art that provides the desired etched MRAM element 200 shown in FIG. 9 may be used in step 370.

Figure 10:
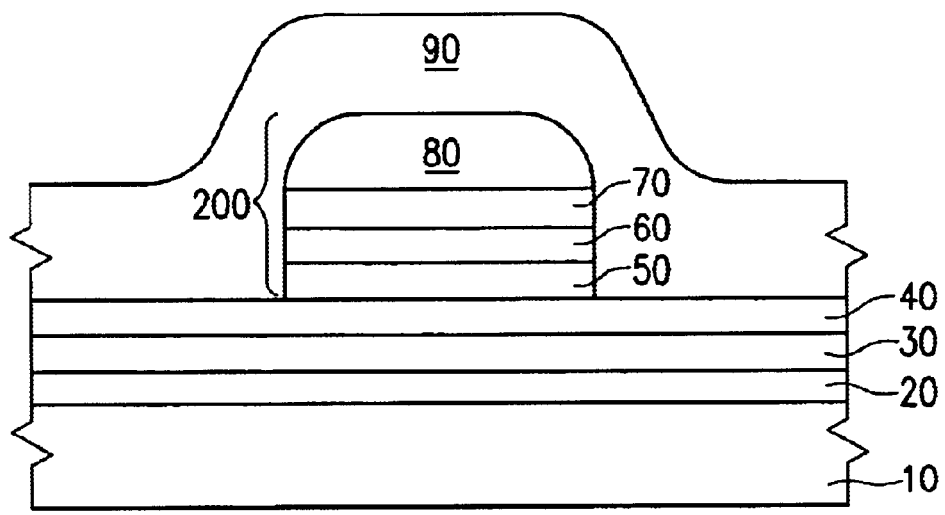
FIG. 10 shows the substrate of FIG. 9 at a processing step subsequent to that shown in FIG. 9.

After etched MRAM element 200 shown in FIG. 9 is obtained, one or more insulating spacers are formed adjacent to the side walls of etched MRAM element 200 and on top of barrier layer 40. One manner of forming these spacers is to use a deposition followed by etch back process. At step 380 in FIG. 1, and as shown in FIG. 10, a spacer-constituent layer 90 comprising the desired material of the spacers is deposited over barrier layer 40 and etched MRAM element 200. Spacer-constituent layer 90 is preferably silicon oxide or silicon nitride, but may be any material compatible with the later etch of step 400 as shown in FIG. 1. Spacer layer is preferably of sufficient thickness to completely cover the side walls of etched MRAM element 200 and to provide a spacer that extends laterally from the side walls of etched MRAM element 200.

Figure 11:
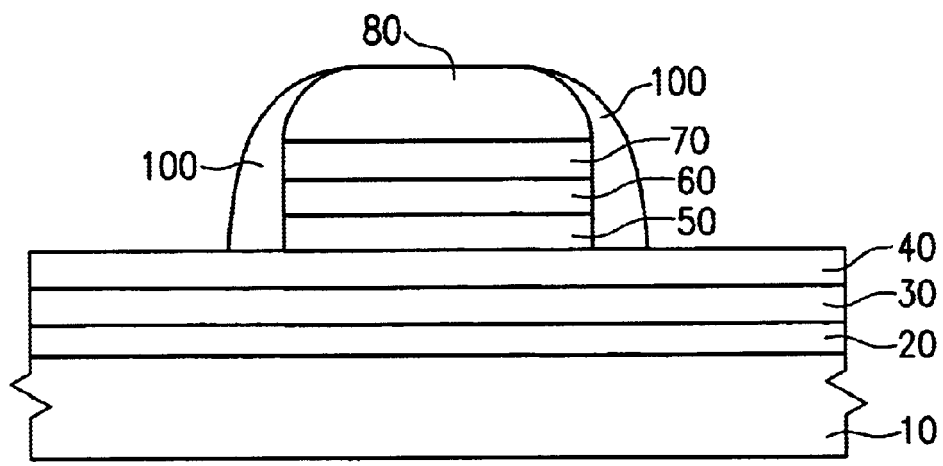
FIG. 11 shows the substrate of FIG. 10 at a processing step subsequent to that shown in FIG. 10.

At step 390 a blanket etch is performed on spacer-constituent layer 90 to provide one or more spacers 100 as shown in FIG. 11. Any etching technique known in the art that provides a remainder spacer 100 may be used in the present invention. Spacer or spacers 100 provided in step 390 extend at least about 10 angstroms and preferably about 200 angstroms from the side walls of etched MRAM element 200.

Figure 11A:
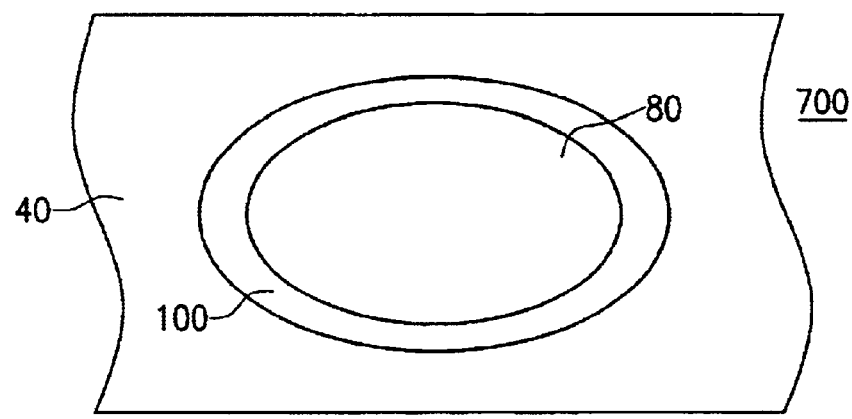
FIG. 11A shows one embodiment of the substrate of FIG. 11 from a top-down profile.
Figure 11B:
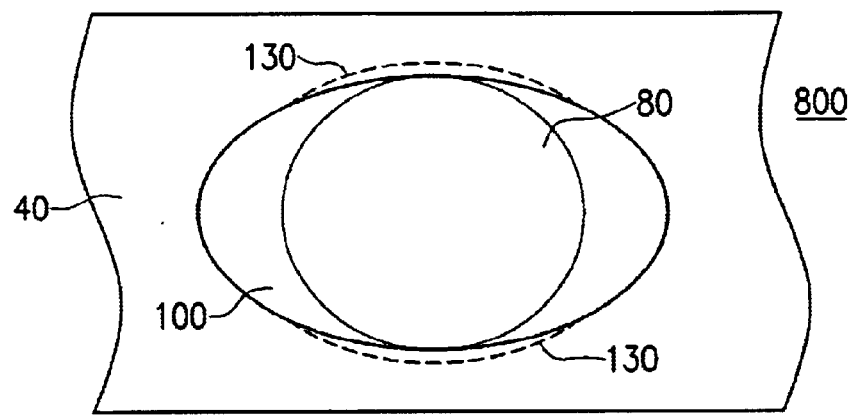
FIG. 11B shows a second embodiment of the substrate of FIG. 11 from a top-down profile.

The number of spacers 100 provided at step 390 depends on the relative top-down profiles of the outer boundary for spacer 100 provided in step 390 and etch mask 80, which defines the side walls of etched MRAM element 200 from which spacer 100 extends. For example, one common MRAM design calls for a top-down profile of the MRAM element which is essentially elliptical. Referring now to FIG. 11A, the cross section view shown in FIG. 11 is represented as a top-down profile assuming an elliptical element 700. Elliptical element 700 utilizes elliptical etch mask 80 and a single concentric elliptical spacer 100 formed in step 390. Of course, the different MRAM element shapes are numerous, and the present invention is not limited according to shape. However, it is important to understand that the number, shape and size of spacers 100 differ according to the etch mask shape and overall MRAM element shape desired. For example, referring now to FIG. 11B, elliptical MRAM element 800 utilizes an etch mask 80 that is less oblong than overall MRAM element 800. This particular embodiment provides two discrete spacers 100 after etch step 390. In another embodiment, referring still to FIG. 11B, elliptical MRAM element 800 may include a single spacer 100, defined by dashed lines 130, rather than two discrete spacers.

Figure 12:
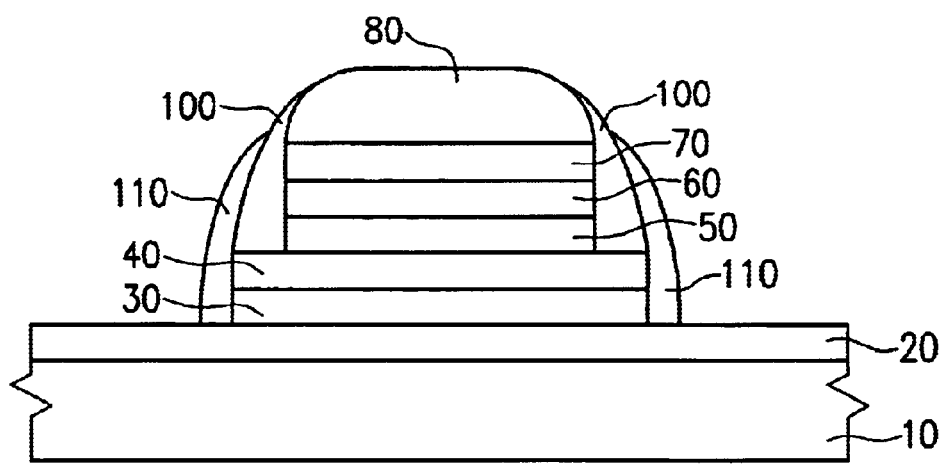
FIG. 12 shows the substrate of FIG. 11 at a processing step subsequent to that shown in FIG. 11.
Figure 12A:
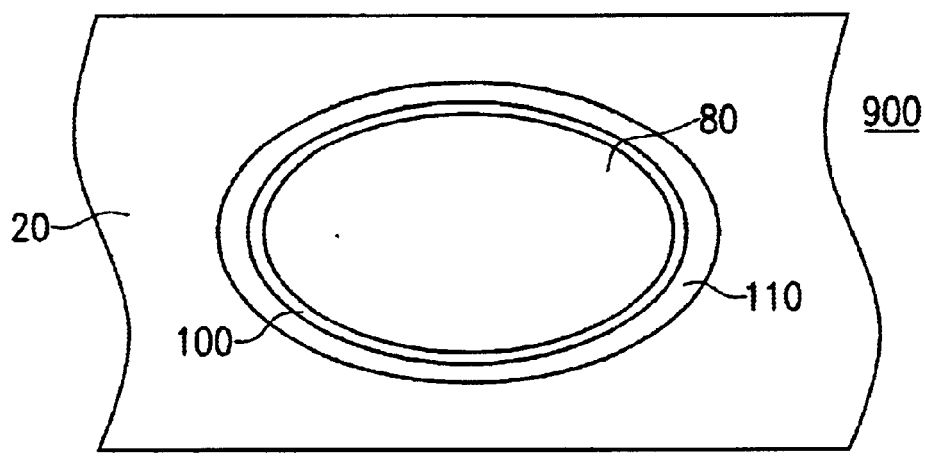
FIG. 12A shows one embodiment of the substrate of FIG. 12 from a top-down profile.

As mentioned above, spacer or spacers 100 provided in step 390 extend at least about 10 angstroms and preferably about 200 angstroms from the side walls of etched MRAM element 200. At step 400, the MRAM element of FIG. 11 is subjected to another etch beginning above the first ferromagnetic layer 30, and in this case barrier layer 40, as shown in FIG. 12. This provides a first ferromagnetic layer 30 and barrier layer 40 which are larger than second ferromagnetic layer 50. The etching of step 400 also provides slag residue 110 covering the sides of spacers 100, barrier layer 40, and first ferromagnetic layer 30. FIG. 12A provides a top-down profile of the final MRAM element 900 shown in FIG. 12 and provided after step 400, where etch mask 80 and spacer 100 are concentric ellipses.

It is clear from FIG. 12 and FIG. 12A how the MRAM element design of the present invention overcomes the problems of magnetic coupling between the sense layer and the pinned layer. Since the sense layer is larger than the pinned layer, the side walls of the two ferromagnetic layers are not co-extensive. This provides greater spatial separation and disalignment between the side walls which greatly reduces magnetic coupling. The incongruous nature of the side walls of the sense layer and the pinned layer also reduces the probability of electrical shorting between the sense layer and the pinned layer through a conductive side wall film which may form during etching to define memory elements.

Figure 13:
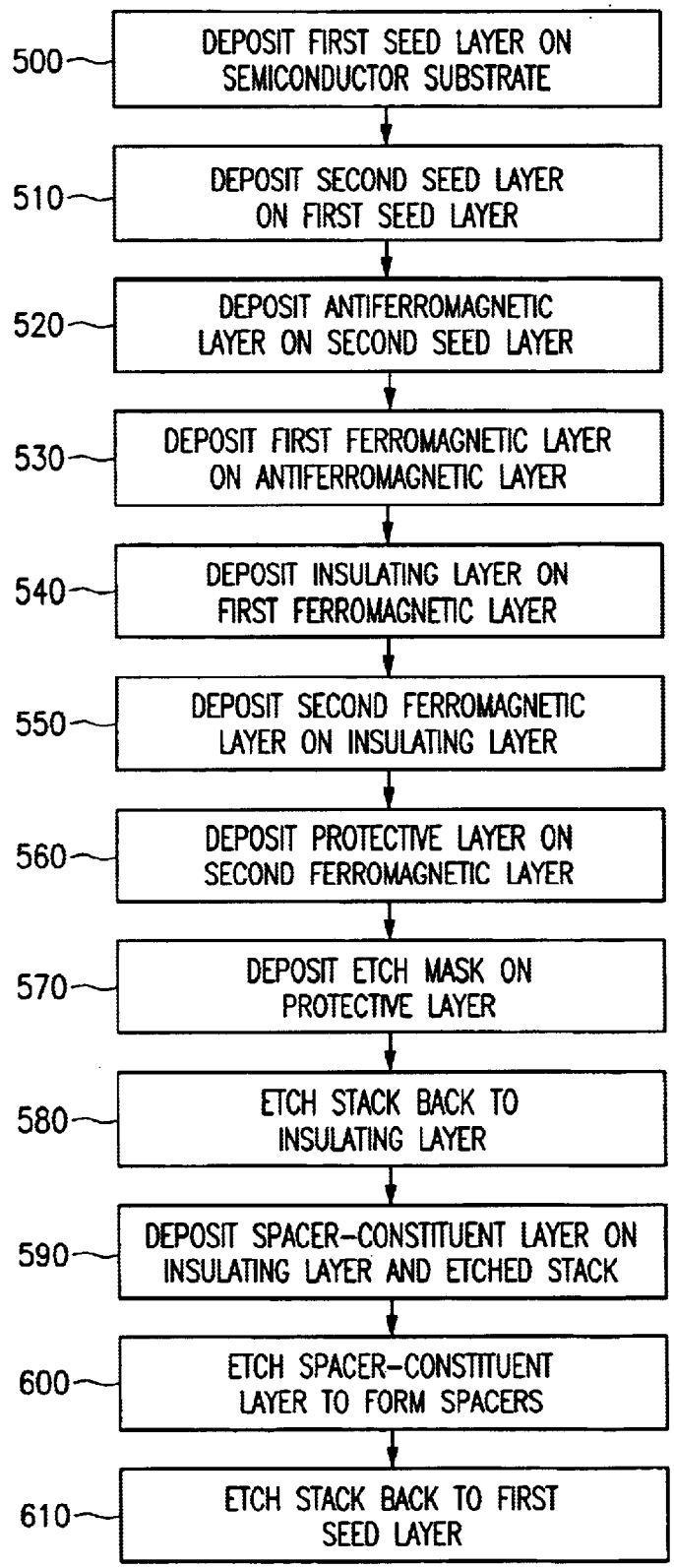
FIG. 13 is a flow chart showing the steps for fabricating a memory element in accordance with a second preferred embodiment of the present invention.

An additional embodiment of the present invention provides reduced magnetic coupling in an MRAM element where a first fabricated ferromagnetic layer is pinned and a second fabricated ferromagnetic layer is the sense layer. The fabrication process shown in FIG. 13 is similar to that of the first embodiment shown in FIG. 1. First, at step 500 a first seed layer 20, preferably tantalum, is deposited on semiconductor substrate 10, referring to FIG. 14. At step 510, however, a first ferromagnetic layer is not deposited. Rather, a second seed layer 120 is deposited over first seed layer 20 at step 510 in FIG. 13. Second seed layer 120 preferably comprises nickel iron, however, any material such as ruthenium which may be imparted with the proper orientation by the first seed layer may be used.

Figure 14:
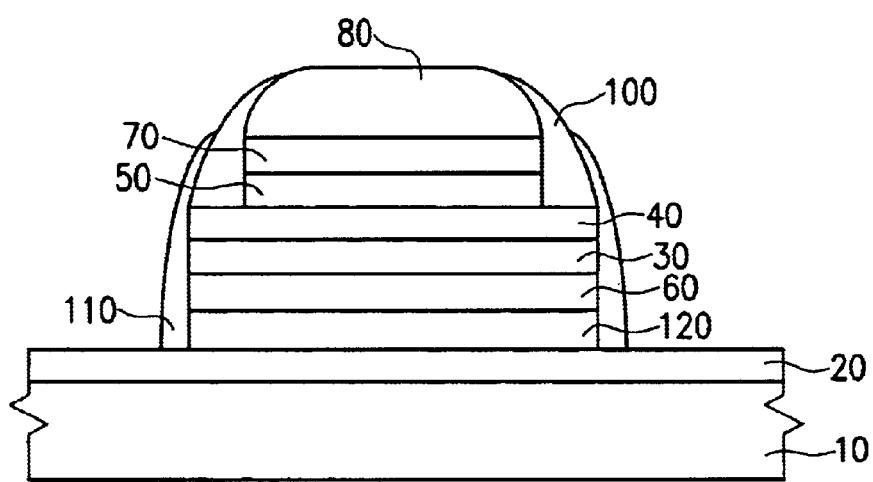
FIG. 14 shows the final memory element provided by the second preferred embodiment of the present invention.

Next, referring to FIG. 14, antiferromagnetic layer 60 is deposited at step 520 over second seed layer 120. Antiferromagnetic layer 60 preferably comprises iridium manganese and preferably has a thickness of about 70 angstroms to about 150 angstroms. Antiferromagnetic layer 60 is followed by first ferromagnetic layer 30, which is deposited over antiferromagnetic layer 60 at step 530. First ferromagnetic layer 30 preferably comprises alloys of one or more of Ni, Fe, or Co, e.g., NiFe or CoFe, and may be deposited by methods known in the art. First ferromagnetic layer 30 preferably has a thickness of about 20 angstroms to about 100 angstroms, and more preferably about 20 angstroms to about 50 angstroms. This configuration causes first ferromagnetic layer 30 to be a pinned ferromagnetic layer. First seed layer 20 imparts a proper orientation to second seed layer 120, which allows antiferromagnetic layer 60 to be deposited in an orientation which provides effective pinning of first ferromagnetic layer 30.

At step 530, an barrier layer 40 is deposited on first ferromagnetic layer 30, as shown in FIG. 14. Barrier layer 40 preferably comprises aluminum oxide, but may also comprise any known MRAM barrier material. A second ferromagnetic layer 50 is next deposited over barrier layer 40 at step 550, referring to FIG. 13. In this embodiment, second ferromagnetic layer 50 is the sense layer. Second ferromagnetic layer 50, as with first ferromagnetic layer 30, preferably comprises alloys of one or more of Ni, Fe, or Co, e.g., NiFe or CoFe, and preferably has a thickness of about 20 angstroms to about 100 angstroms, and more preferably about 20 angstroms to about 50 angstroms. Second ferromagnetic layer 50 may be deposited by methods known in the art.

Referring to FIG. 13, at next step 560, a protective layer 70 is deposited over second ferromagnetic layer 50. Protective layer 70 preferably comprises Ta, although other suitable materials may be used. After step 570, etch mask 80 has been deposited in a desired pattern on protective layer 70. Etch mask 80 may be any shape and dimension desireable in an MRAM element. Etch mask 80 may be any mask known in the art that is compatible with etching the layers deposited in the stack of the present invention.

At step 580 in FIG. 13, the MRAM element stack provided after step 570 is etched back through protective layer 70 and second ferromagnetic layer 50. The etching ceases before first ferromagnetic layer 30, for example at barrier layer 40. Any etching technique known in the art that suitably etches the layers desired to be etched may be used in step 580, e.g., protective layer 70 and second ferromagnetic layer 50.

After the etched MRAM layers are obtained, insulating spacers are formed adjacent to the side walls of the etched MRAM layers and on top of barrier layer 40. One manner of forming these spacers is to use a deposition followed by etch back process. At step 590 in FIG. 13, a spacer-constituent layer 90 comprising the desired material of the spacers is deposited over barrier layer 40 and the etched MRAM layers, protective layer 70 and second ferromagnetic layer 50. Spacer-constituent layer 90 is preferably silicon oxide or silicon nitride, but may be any material compatible with the later etch of step 610 as shown in FIG. 13. Spacer-constituent layer 90 is preferably of sufficient thickness to completely cover the side walls of the etched MRAM layers and to provide a spacer that extends laterally from the side walls of etched MRAM element.

At step 600 a blanket etch is performed on spacer-constituent layer 90 to provide at least one spacer 100. Any etching technique known in the art that provides remainder spacer 100 may be used in the present invention. As mentioned above, spacer 100 extends laterally at least about 10 angstroms and preferably about 200 angstroms from the side walls of previously etched MRAM element. At step 610, the MRAM element provided in step 600 is subjected to another etch beginning above the first ferromagnetic layer 30, and in this case barrier layer 40. This provides a second seed layer 120, an antiferromagnetic layer 60, a first ferromagnetic layer 30, and a barrier layer 40 which are all larger than second ferromagnetic layer 50. The etching of step 400 also provides re-deposited material 110 covering the sides of spacers 100, barrier layer 40, and first ferromagnetic layer 30.

The final MRAM element provided in accordance with the second embodiment is shown in FIG. 14.

The increased size of first ferromagnetic layer 30 compared to second ferromagnetic layer 50 provides reduced magnetic coupling between first ferromagnetic layer 30 and second ferromagnetic layer 50. Specifically, in the first embodiment where an MRAM element includes a sense layer extending about 200 angstroms beyond the side wall that includes the pinned layer magnetic coupling between the ferromagnetic layers is reduced by approximately 70%. This reduction in magnetic coupling allows for a more uniform magnetic switching field for switching the sense layer. As little as about 15 to about 20 angstroms difference in the width of a first ferromagnetic layer and the width of a second ferromagnetic layer provided by the present invention may be sufficient to adequately decouple the ferromagnetic layers.

An additional benefit of the present invention is that there is a lower frequency of electrical shorting between the ferromagnetic layers compared with a typical MRAM element.

It should be readily understood that the invention can be modified to reflect any number of variations, alterations, substitutions or equivalent arrangements not heretofore described, but which are commensurate with the spirit and scope of the invention. For example, the present invention may be applied in tunnel magnetoresistive (TMR) devices, giant magnetoresistive (GMR) devices, or any other memory element that utilizes multiple ferromagnetic layers by providing a diversity of sizes among the ferromagnetic layers. Accordingly, the invention is not to be seen as limited by the foregoing description, but is only limited by the scope of the appended claims.

What is claimed as new and desired to be protected by Letters Patent of the United States is:

1. A memory element comprising:
   a first ferromagnetic layer;
   a second ferromagnetic layer over said first ferromagnetic layer;
   wherein said first ferromagnetic layer extends laterally beyond said second ferromagnetic layer; and
   wherein the resistance provided by the relative magnetization directions of said first and said second ferromagnetic layers represents data stored in said memory element.

2. A memory element of claim 1 further comprising a barrier layer between said first ferromagnetic layer and said second ferromagnetic layer.

3. A memory element of claim 2 wherein said first ferromagnetic layer is a sense layer and said second ferromagnetic layer is a pinned layer.

4. A memory element of claim 3 wherein said first ferromagnetic layer extends laterally at least about 10 angstroms beyond said second ferromagnetic layer.

5. A memory element of claim 4 wherein said first ferromagnetic layer extends laterally about 200 angstroms beyond said second ferromagnetic layer.

6. A memory element of claim 3 wherein said first ferromagnetic layer has a thickness of about 20 angstroms to about 100 angstroms.

7. A memory element of claim 6 wherein said first ferromagnetic layer has a thickness of about 20 angstroms to about 50 angstroms.

8. A memory element of claim 3 wherein said second ferromagnetic layer has a thickness of about 20 angstroms to about 100 angstroms.

9. A memory element of claim 8 wherein said second ferromagnetic layer has a thickness of about 20 angstroms to about 50 angstroms.

10. A memory element of claim 3 further comprising an antiferromagnetic layer located over said second ferromagnetic layer.

11. A memory element of claim 10 wherein said antiferromagnetic layer has a thickness of about 70 angstroms to about 150 angstroms.

12. A memory element of claim 10 wherein said antiferromagnetic layer comprises iridium manganese.

13. A memory element of claim 3 wherein said barrier layer comprises an aluminum oxide tunnel barrier.

14. A memory element of claim 3 further comprising a protective layer located over said second ferromagnetic layer.

15. A memory element of claim 3 further comprising at least one spacer located over said first ferromagnetic layer and lateral to said second ferromagnetic layer.

16. A memory element of claim 15 wherein said at least one spacer comprises a dielectric material.

17. A memory element of claim 15 wherein said at least one spacer extends laterally at least about 10 angstroms from said second ferromagnetic layer.

18. A memory element of claim 17 wherein said at least one spacer extends laterally about 200 angstroms from said second ferromagnetic layer.

19. A memory element of claim 2 wherein said first ferromagnetic layer is a pinned layer and said second ferromagnetic layer is a sense layer.

20. A memory element of claim 19 wherein said first ferromagnetic layer extends laterally at least about 10 angstroms beyond said second ferromagnetic layer.

21. A memory element of claim 20 wherein said first ferromagnetic layer extends laterally about 200 angstroms beyond said second ferromagnetic layer.

22. A memory element of claim 19 wherein said first ferromagnetic layer has a thickness of about 20 angstroms to about 100 angstroms.

23. A memory element of claim 22 wherein said first ferromagnetic layer has a thickness of about 20 angstroms to about 50 angstroms.

24. A memory element of claim 19 wherein said second ferromagnetic layer has a thickness of about 20 angstroms to about 100 angstroms.

25. A memory element of claim 24 wherein said second ferromagnetic layer has a thickness of about 20 angstroms to about 50 angstroms.

26. A memory element of claim 19 further comprising an antiferromagnetic layer located over said second ferromagnetic layer.

27. A memory element of claim 26 wherein said antiferromagnetic layer has a thickness of about 70 angstroms to about 150 angstroms.

28. A memory element of claim 26 wherein said antiferromagnetic layer comprises iridium manganese.

29. A memory element of claim 19 wherein said barrier layer comprises an aluminum oxide tunnel barrier.

30. A memory element of claim 19 further comprising a protective layer located over said second ferromagnetic layer.

31. A memory element of claim 19 further comprising at least one spacer located over said first ferromagnetic layer and lateral to said second ferromagnetic layer.

32. A memory element of claim 31 wherein said at least one spacer comprises a dielectric material.

33. A memory element of claim 31 wherein said at least one spacer extends laterally about 200 angstroms from said second ferromagnetic layer.

34. A memory element comprising:
    a first ferromagnetic layer having at least one side wall;
    a barrier layer over said first ferromagnetic layer;
    a second ferromagnetic layer over said barrier layer having at least one side wall;
    an antiferromagnetic layer for pinning one of said first and said second
    wherein one of said first and said second ferromagnetic layers extends laterally at least about 10 angstroms beyond said at least one side wall of the other of said first and said second ferromagnetic layers; and
    wherein the resistance provided by the relative magnetization directions of said first and said second ferromagnetic layers represents data stored in said memory element.

35. A memory element of claim 34 wherein said one of said first and said second ferromagnetic layers extends laterally from about 10 angstroms to about 200 angstroms beyond said at least one side wall of the other of said first and said second ferromagnetic layers.

36. A memory element of claim 35 wherein said one of said first and said second ferromagnetic layer extends laterally about 200 angstroms beyond said at least one side wall of the other of said first and said second ferromagnetic layers.

37. A memory element comprising:
    a substrate;
    a seed layer comprising tantalum over said substrate;

a first ferromagnetic layer having at least one side wall formed over said seed layer;

a barrier layer comprising an aluminum oxide tunnel barrier formed over said first ferromagnetic layer;

a second ferromagnetic layer having at least one side wall formed over said barrier layer;

an antiferromagnetic layer comprising iridium manganese formed over said second ferromagnetic layer;

a protective layer comprising tantalum formed over said antiferromagnetic layer;

wherein said at least one side wall of said first ferromagnetic layer extends laterally at least about 10 angstroms beyond said at least one side wall of said second ferromagnetic layer; and wherein the resistance provided by the relative magnetization directions of said first and said second ferromagnetic layers represents data stored in said memory element.

38. A memory element comprising:

a substrate;

a first seed layer comprising tantalum having at least one side wall formed over said substrate;

a second seed layer comprising nickel iron formed over said first seed layer;

an antiferromagnetic layer comprising iridium manganese formed over said second seed layer;

a first ferromagnetic layer having at least one side wall formed over said antiferromagnetic layer;

an barrier layer comprising an aluminum oxide tunnel barrier formed over said first ferromagnetic layer;

a second ferromagnetic layer having at least one side wall formed over said barrier layer;

a protective layer comprising tantalum formed over said second ferromagnetic layer;

wherein said at least one side wall of said first ferromagnetic layer extends laterally at least about 10 angstroms beyond said at least one side wall of said second ferromagnetic layer; and wherein the resistance provided by the relative magnetization directions of said first and said second ferromagnetic layers represents data stored in said memory element.

* * * * *